United States Patent
Sherman et al.

[11] Patent Number: 5,928,799
[45] Date of Patent: *Jul. 27, 1999

[54] HIGH TEMPERATURE, HIGH PRESSURE, EROSION AND CORROSION RESISTANT COMPOSITE STRUCTURE

[75] Inventors: Andrew Sherman, Granada Hills; Victor Arrietta, Panorama, both of Calif.

[73] Assignee: Ultramet, Pacoima, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/490,335

[22] Filed: Jun. 14, 1995

[51] Int. Cl.⁶ .............................. B32B 15/00; F41A 21/02
[52] U.S. Cl. .......................... 428/655; 428/663; 428/665; 89/16
[58] Field of Search .................................. 428/610, 655, 428/663, 664, 665, 670; 89/16; 420/433

[56] References Cited

U.S. PATENT DOCUMENTS

| | | | |
|---|---|---|---|
| 2,391,458 | 12/1945 | Hensel | 420/433 |
| 2,512,141 | 6/1950 | Ma et al. | 428/663 |
| 3,024,522 | 3/1962 | Cacciotti | 428/655 |
| 3,318,683 | 5/1967 | Foster et al. | 420/433 |
| 3,542,583 | 11/1970 | Small | 428/670 |
| 3,627,561 | 12/1971 | Richards | 428/670 |
| 3,703,405 | 11/1972 | Brenner et al. | 428/663 |
| 3,956,657 | 5/1976 | Siegle | 313/214 |
| 4,155,660 | 5/1979 | Takahashi et al. | 420/433 |
| 4,227,112 | 10/1980 | Waugh et al. | 313/41 |
| 4,409,881 | 10/1983 | van der Wielen | 89/16 |
| 4,419,202 | 12/1983 | Gibson | 204/192 N |
| 4,577,431 | 3/1986 | Siemers et al. | 42/76 A |
| 4,669,212 | 6/1987 | Jackson et al. | 42/76.02 |
| 4,685,236 | 8/1987 | May | 42/76.02 |
| 4,842,182 | 6/1989 | Szecket | 228/108 |
| 4,915,733 | 4/1990 | Schutz et al. | 420/433 |
| 5,226,579 | 7/1993 | Bergmann et al. | 228/107 |
| 5,508,118 | 4/1996 | Hayashi et al. | 428/610 |
| 5,657,568 | 8/1997 | Christensen | 42/76.02 |

FOREIGN PATENT DOCUMENTS 1188622  4/1970  United Kingdom ................... 428/663

OTHER PUBLICATIONS

L.W. Kates, "Rhenium Metal–Its Properties and Future", Materials & Methods, pp. 88–91, Mar. 1954.
Edited by Howard E. Boyer and Timothy L. Gall, Copyright May 1985, pp. 30–58.

Primary Examiner—John J. Zimmerman
Attorney, Agent, or Firm—Bruce A. Jagger

[57] ABSTRACT

The present invention is a metallic composite which is resistant to erosion and corrosion at the high temperatures and pressures which are encountered in gun tubes, including projectile launchers. This composite comprises a ductile layer of rhenium or a rhenium alloy containing more than 20 percent rhenium, and a layer of a lower cost high strength material such as steel, nickel, nickel alloy, cobalt, or cobalt alloy. A solid solution of the two metals is formed between the two layers making a metallurgical bond. The metallurgical bond may be enhanced through the use of a bond promoter having solubility with both metallic layers.

10 Claims, 1 Drawing Sheet

5,928,799

HIGH TEMPERATURE, HIGH PRESSURE, EROSION AND CORROSION RESISTANT COMPOSITE STRUCTURE

BACKGROUND OF THE INVENTION

1. Field of the Invention

The present invention relates to the field of high strength, high pressure, high temperature, corrosion and erosion resistant structures and their methods of manufacture. More particularly, this invention relates to structures which are capable of withstanding heavy loads and elevated temperatures and pressures for extended periods of time. Such structures are of particular interest in the field of gun tubes including projectile launchers.

2. Description of the Prior Art

It had been extremely difficult to produce structures which can retain structural integrity and not corrode or erode when exposed repeatedly to high pressure gases at temperatures in excess of 2,000 degrees Celsius. Materials that do not easily corrode or erode do not have the structural strength and ductility to withstand substantial thermal and structural stress. Conversely, materials which can withstand substantial thermal and structural stress are generally subject to rapid erosion and corrosion.

These materials limitations had substantially hampered achievement of maximum performance and component life in a number of fields, notably ordnance. Propellants used in ordnance include, for example, HDX and RDX double-base and composite propellants. Gun tubes, for example, are used in most artillery systems including small arms, anti-aircraft guns, anti-tank weapons, mortars and missile launchers. Gun tubes are subjected to multiple shots over their lifetimes. Machine gun tubes, for example, are very often exposed to hundreds of shots per minute. Each shot subjects the tube to high thermal shock and gas pressures as the shell fires and high structural loads as each projectile accelerates down the tube. Under these conditions brittle materials tend to fail rapidly. Even ductile materials have poor service life and reliability.

To achieve optimum projectile velocity and system performance the temperature of the propellant gasses may be as high as 3000–3400 degrees Celsius and gas pressures may be as high as 60,000 to 150,000 pounds per square inch. It had been found that if shells are made with optimum propellant chemistries catastrophic failure of the gun tubes occurs in a very few minutes, often with only from 100 to 1,000 shots. If shells are made with close to optimum propellant chemistries gun tubes wear out more rapidly, thus limiting their useful lives. It had been necessary in practice to make artillery shells with much less than optimum propellant chemistries so as to keep the operating temperatures and heat fluxes within the limits of the gun tube materials. As a consequence projectile velocity and performance had been severely limited: one consequence had been limitation of the maximum number of rounds which can be fired.

Improving the temperature capabilities of gun tubes would substantially improve ammunition and system lethality. The lives of gun tubes, that is the maximum number of rounds which can be fired, would be extended resulting in considerable financial savings.

Applications exist outside the armament field for structures which are capable of withstanding shock and high structural loads in highly corrosive, high temperature environments. The absence of such structures limits or precludes the use of some reactions in the chemical process industry. Such structures would also be useful in the propulsion field (e.g. rockets and arc-jets) as well as in the nuclear and metallurgical industries. Such structures could, for example, find great utility in fiber and wire drawing machines, shock tubes and plasma arc equipment.

Development of a material which can retain structural integrity and shows minimal weight, dimensional, microstructural, or other compositional changes when exposed to high temperatures and high pressures would represent a great improvement in the field of materials engineering. Such a material would satisfy a long felt need of ordnance, nuclear, metallurgical and other engineers.

BRIEF SUMMARY OF THE INVENTION

The present invention is a composite material or structure which retains structural integrity and does not corrode or erode when exposed to high temperatures and high pressures. This invention includes a high strength, high temperature, high pressure, corrosion and erosion resistant composite structural material, and composite structures formed therefrom.

The present invention comprises, for example, a first layer of high temperature, erosion and corrosion resistant metal, and a second layer of structural material having a tensile strength greater than approximately 20,000 pounds per square inch and preferably in excess of 100,000 pounds per square inch. Niobium, for example, has a tensile strength of approximately 20,000 pounds per square inch. This represents approximately the lowest possible tensile strength. Many structural materials have strengths of as much as 160,000 to 180,000 pounds per square inch, including, for example, carbon-carbon composites.

The composite structure is so arranged that during usage for its intended purpose the layer of resistant metal is exposed to a high temperature corrosive and erosive environment. The layer of structural material serves to structurally support the resistant metal layer, and the resistant metal protects the structural material from erosion and corrosion.

The high temperature, erosion and corrosion resistant metal may, for example, be pure rhenium or a rhenium alloy containing over approximately 20 percent rhenium, for example molybdenum-49 rhenium, molybdenum-30 rhenium, tungsten-24 rhenium or rhenium and platinum metal group alloys, or the like. The structural metal or material may, for example, be steel, niobium or a cobalt or nickel alloy, for example, Inconel 718 (an alloy composition containing about 19 percent chromium, 52.5 percent nickel, 3 percent molybdenum, 5.1 percent niobium, 0.9 percent titanium, 0.5 percent aluminum, 18.5 percent iron and the balance carbon and copper), Hastelloy X (an alloy composition containing about 22 percent chromium, 49 percent nickel, 9 percent molybdenum, 0.6 percent tungsten, 2 percent aluminum, 15.8 percent iron, 0.15 percent carbon, and the balance cobalt), Stellite (a series of alloy compositions containing about 35–80 percent cobalt, 10 to 40 percent chromium, 0 to 25 percent tungsten, and 0 to 10 percent molybdenum), Rene 41 (an alloy composition containing about 19 percent chromium, 55 percent nickel, 11 percent cobalt, 10 percent molybdenum, 3.1 percent titanium, 1.5 percent aluminum, and traces of iron, carbon and boron), 17–4PH stainless steel (an alloy composition containing about 16.5 percent chromium, 4.0–4.25 percent nickel, 0.7–1 percent manganese, 0.04–0.07 percent carbon, 0–1 percent silicon, 4–3.6 percent copper, and the balance niobium and titanium), Invar 909 (an alloy composition containing 36 percent nickel, 63.8 percent iron, and 0.2 percent carbon) or 4340 steel, or carbon-fiber composite structure, or the like.

When the structural layer is metallic, the structure preferably also includes, for example, a transition layer which forms a metallurgical bond between the first and second layers. The transition or interlayer includes a bond enhancer and in general comprises a solid solution of the metals in the first and second layers together with the bond enhancer. The interlayer may, for example, be nickel or cobalt. The purpose of the interlayer is to promote metallurgical bonding between the first and second layers. The metal of the interlayer is soluble in the metals of the first and second layers.

This new composite material is capable of withstanding hot, highly corrosive environments for several hours, usually accrued a few seconds or less at a time, while withstanding substantial pressure, and structural loads.

When the composite structure is, for example, in the form of a tube, the tube should be fabricated so that its strength exceeds by a significant margin, preferably at least twice, the requirement imposed by the gas pressure within the tube at the anticipated operating temperatures.

An appreciation of the other aims and objectives of the present invention, and a more complete and comprehensive understanding of it may be achieved by referring to the accompanying drawings and studying the following description of a preferred embodiment. The accompanying drawings and description are provided for the purposes of illustration and not limitation.

DETAILED DESCRIPTION OF THE PREFERRED EMBODIMENT

Figure 1:
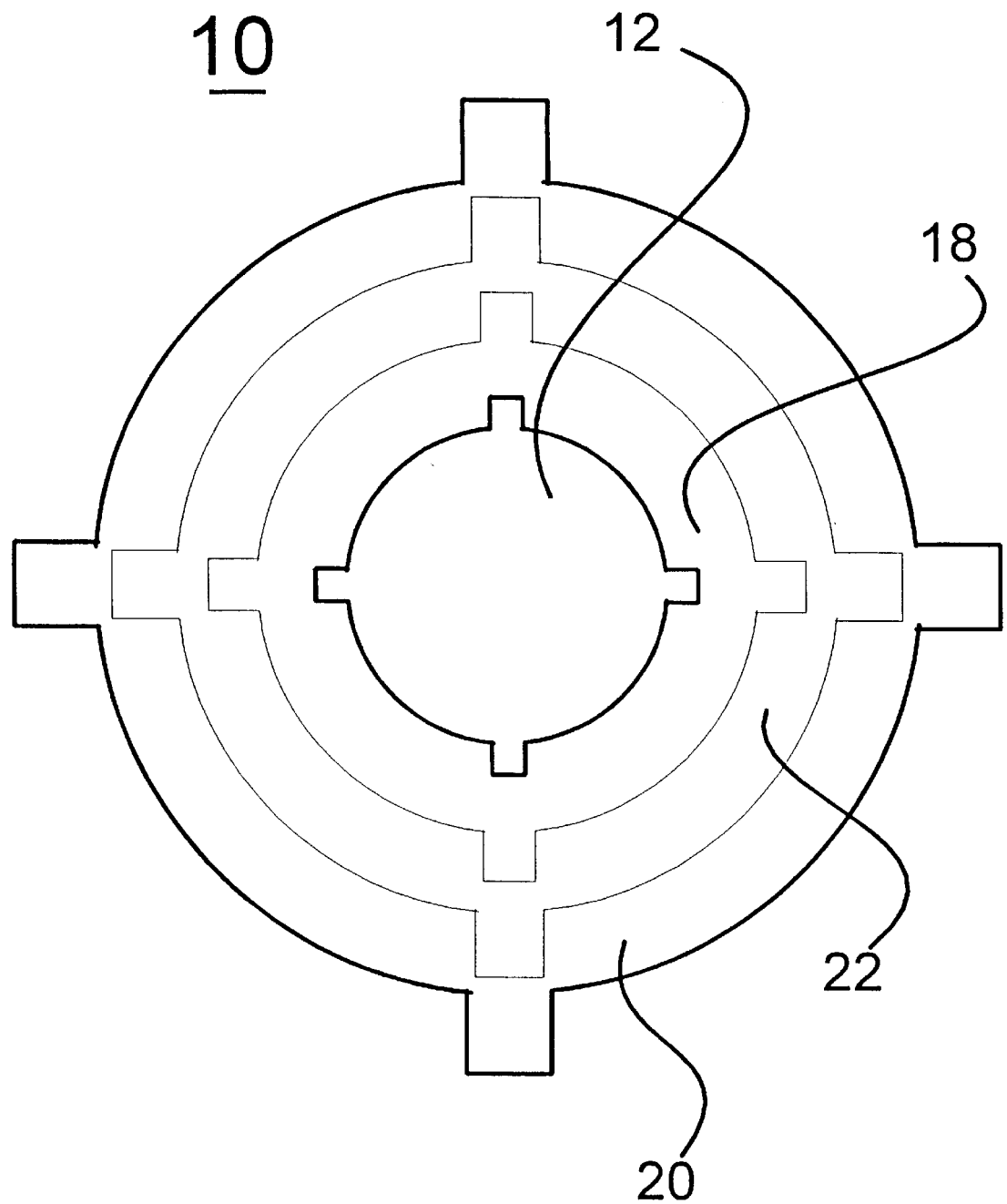
FIG. 1 is a cross section through a rifled gun barrel liner produced in accordance with this invention.

The requirement of erosion and corrosion resistance at temperatures preferably in excess of 2,000 degrees Celsius severely limits the choice of materials. Another requirement is ductility. The material must also be sufficiently ductile at use temperatures to permit some elongation without cracking. Elongation in excess of 4 percent and preferably in excess of 8 percent is effective to prevent cracking. Rhenium and its alloys with molybdenum, tungsten and the platinum group metals are capable of withstanding highly corrosive, high temperature conditions. These materials also possess sufficient strength and low temperature ductility to withstand substantial thermal and structural loads. For example the addition of 76 weight percent molybdenum to rhenium raises the ductile to brittle transition temperature of the alloy from non-existent to around room temperature. It has been found that rhenium and rhenium alloy structures prepared by chemical vapor deposition are inherently ductile and meet the required elongation criteria. The material should have a ductile to brittle transition temperature below approximately 400 degrees Celsius.

While structures could be constructed purely from rhenium and rhenium alloys the high cost and weight of these materials coupled with the difficulty of fabrication and machining precludes their use in many applications. High strength structural materials, such as steel, nickel and cobalt alloys, while cheaper and easier to fabricate are generally subject to rapid and catastrophic erosion and oxidation at elevated temperatures.

It was previously thought that rhenium was too expensive and underwent oxidation too rapidly to be used in gun tubes. However, the inventors have demonstrated that rhenium is the most corrosion resistant element known under solid propellant exhaust conditions. The inventors have made useful and economical shapes by forming a coating of rhenium on a supporting structural member. These composite structures have proved highly erosion resistant and eminently suitable in combustion or electrothermal environments in excess of 1000 degrees Celsius.

The inventors have found that rhenium alloys, particularly those made with molybdenum, tungsten or other refractory metals exhibit low temperature ductile behavior making them also suitable for high thermal stress environments. Some minimum erosion resistance is lost when using these alloys but they are cheaper to fabricate. Rhenium alloys which contain more than about 20 percent by weight of rhenium and have melting points in excess of about 1400 degrees Celsius have been found to be suitable for use according to the present invention.

A structure which is capable of withstanding high temperature, high stress, shock and catastrophically corrosive and erosive conditions can be produced according to the current invention, for example, by providing an erosion resistant layer comprised of rhenium or a rhenium alloy which is metallurgically bonded through a transition layer to a supporting, load-bearing substrate or structure comprised of a lower cost material such as steel or a nickel alloy. The erosion and corrosion resistant layer protects the supporting structure from corrosive and erosive conditions, and high temperatures.

Particularly good results have been obtained, for example, with pure rhenium and molybdenum-rhenium binary alloys. The composite may, for example, be fabricated in several ways. Preferably the pure rhenium or rhenium alloy is deposited or formed on a mandrel. Then the load bearing structural material is deposited or formed over the rhenium or rhenium alloy under conditions which cause a metallurgical bond to be formed. Alternatively, the rhenium or rhenium alloy can be applied or deposited directly onto the structural material substrate.

Whichever method is chosen, the rhenium or rhenium alloy is preferably deposited by chemical vapor deposition. Other suitable methods include, for example, electroplating, hot pressing, co-extrusion, arc plasma and plasma spraying. Chemical vapor deposition is a well known process. It consists essentially of exposing a heated substrate to a gaseous compound of the material to be deposited. The gas decomposes on the heated substrate thus forming the desired deposit. It is thus easy to form coatings on interior and exterior surfaces.

An interlayer, such as nickel or cobalt or alloys thereof, and a heat treatment step may be necessary to promote proper formation of the metallurgical bond. If the mandrel fabrication process is used, after the mandrel is removed a free standing composite structure results.

The transition layer is critical to fabrication of composites in accordance with this invention. The transition layer, for example, is a solid solution or composite of the rhenium or rhenium alloy and the structural metal. If an interlayer is used, that metal is dispersed throughout the transition layer also.

The transition layer is ductile but its properties transition from those of the rhenium or rhenium alloy to those of the structural substrate. For example the melting point decreases with transition from the rhenium or rhenium alloy to the structural substrate. Corrosion and erosion resistance decreases with approach to the structural material but remains closer to that of the rhenium or rhenium alloy throughout most of the transition layer. It has been found that the metallurgical bond is so tight that there is no tendency for the layers to delaminate.

Typically the erosion and corrosion resistant layer is, for example, from 0.003 to 0.040 inch thick and the structural substrate is from 0.1 to 1.0 inch thick. However, these dimensions can be varied considerably to suit various end uses.

FIG. 1 shows a cross section through a rifled gun barrel liner 10 produced in accordance with this invention. According to the current invention, chemical vapor deposition or other means are utilized to form successive layers 18 and 20 of a structure such that the layers are metallurgically bonded together by a transition layer 22. In order to enable an understanding of the invention, the layers are not shown to scale. The first layer 18 is erosion and corrosion resistant and is capable of withstanding highly erosive environments at temperatures in excess of 1,000 degrees Celsius and preferably in the range of 2,000 to 2,200 degrees Celsius. The high strength layer 20 has tensile strengths in excess of 20,000 pounds per square inch and preferably over 100,000 pounds per square inch. Because of the insulating effect of the first layer 18, the high strength layer 20 is not required to withstand temperatures as high as those experienced by the corrosion resistant layer 18, nor is it exposed to the corrosive and erosive gas environment.

The first layer 18 is preferably made from pure rhenium or a high rhenium content alloy such as molybdenum-49 rhenium, molybdenum-30 rhenium, tungsten-24 rhenium or rhenium and platinum metal group alloys. The structural layer 20 is typically made from niobium, or nickel and steel alloys such as Inconel 718, Hastelloy X, Stellite, Rene 41, 17–4 PH stainless, Invar 909 or 4340 steel. Alternatively, the structural layer 20 may be formed from a high strength carbon fiber composite as described, for example, in Tuffias et al, Ser. No. 08/254,515, filed Jun. 6, 1994, entitled "Composite Structure", which disclosure is hereby incorporated herein by reference as though fully set forth at length hereat. According to one embodiment, after deposition the two layers 18 and 20 are processed so as to form a transition layer 22 between and metallurgically bonding the two layers 18 and 20. In general the bonding is preferably accomplished, for example, through heat treatment.

There are two basic methods of fabricating a composite structure 10. In one method a mandrel 12 is coated with the first layer 18 of corrosion and erosion resistant material. Coating may be carried out, for example, by plating, hot pressing, plasma-spray, forging, or, preferably, by chemical vapor deposition. The structural material 20 is applied over the first layer 18. Then the layers 18 and 20 are processed, typically by heat treating, to produce the transition layer 22. Finally the mandrel is removed to leave a free standing structure 10.

An interlayer, not illustrated, may, if desired, be applied between the first 18 and second 20 layers. The interlayer promotes formation of the metallurgical bond between the two layers 18 and 20. The metal of the interlayer is incorporated into the transition layer 22.

In the alternate method of fabrication, structural material is fabricated into the desired tubular shape 20. A layer 18 of corrosion and erosion resistant material is applied to the bore of the tube 20. Again the layers 18 and 20 are processed to produce the transition layer 22 and application of an interlayer is again optional.

The following examples are provided for purposes of illustration only and not limitation.

EXAMPLE 1

According to the preferred embodiment, a liner for a 25 millimeter gun tube of a rifled configuration having a length of 16 inches and an bore diameter of 1 inch was fabricated. A molybdenum mandrel was prepared with the exterior surface machined to a shape which matched the desired interior shape of the gun tube (net shape). A pure rhenium coating was chemically vapor deposited on the mandrel from rhenium pentachloride at a temperature of approximately 1150 degrees Celsius. The coating was allowed to build up to a thickness of about 0.020 inches. A bond enhancing layer of nickel (less than approximately 0.001 inches thick) was applied to the surface of the rhenium coating by conventional electrolytic procedures. A layer of Inconel 909 approximately 0.5 inches thick was then applied to the rhenium-coated mandrel by hot-pressing. The hot pressing temperature was approximately 1050 degrees Celsius and the part was held at temperature for 4 hours to allow a metallurgical bond to form. The structure was then heat treated to increase its strength by holding at 850 for about 2 hours and then 550 degrees Celsius for about 2 hours during cooling. The outside diameter of the tube was machined on centers provided by the molybdenum mandrel to final required dimensions. All exposed Inconel 909 surfaces were masked with an epoxy type resin and the molybdenum mandrel was removed by dissolving with dilute sulfuric acid solution. The resulting structure is suitable for use as an insert in a tube of 4340 gun steel alloy to form a gun barrel. The insert is shrink fitted to the gun steel alloy tube with at least approximately a 0.002, and preferably, 0.005 inches interference fit.

Repetition of this example using, for example, a bond enhancing layer of cobalt or alloys of nickel and cobalt provides a satisfactory bond between the rhenium and Inconel 909.

Repetition of this example using, for example, a titanium alloy containing about 0.10 weight percent of ruthenium as the supporting structure and ruthenium as the bond enhancer results in a satisfactory structure.

Up to approximately 80 percent molybdenum can be codeposited with the rhenium with satisfactory results.

EXAMPLE 2

A 25 millimeter, smooth bore gun tube insert was fabricated. An Inconel 909 tube was machined to required dimensions except that the bore was machined 0.020 inches oversize. A sulfamate nickel layer was applied to the bore, followed by 0.012–0.015 inches of rhenium. The sulfamate nickel layer was applied by electroplating. The rhenium was deposited from the pentachloride at a temperature of about 1050 degrees Celsius using chemical vapor deposition techniques. The bore was then honed to provide the finished dimension and surface finish. The finished insert is suitable for assembly by shrink fitting into a tube of gun barrel steel.

Post fabrication metallography revealed a diffuse interface region of approximately 0.002 inches thickness in which the rhenium content decreased to the Inconel 909 composition. The nickel interlayer had completely diffused and did not remain as a separate layer after fabrication. Adhesion of the rhenium to the Inconel was very good, being in excess of 10,000 pounds per square inch.

Cobalt and mixtures of nickel and cobalt may be substituted for the nickel herein with acceptable metallurgical bonding results, particularly when the supporting structure is an iron containing alloy, including super alloys. Thus, Group VIII metals having atomic numbers between 27 and 28, which includes the individual metals as well as mixtures of cobalt and nickel, may be used.

EXAMPLE 3

An insert similar to the one described in Example 1 was prepared for a 0.50 cal tube. Inverse net-shape rifling was applied to the molybdenum mandrel using a rifling machine. A 0.020 inch thick rhenium deposit was formed on the exterior surface of the molybdenum mandrel. The exterior surface of the mandrel was the shape and size of the desired interior surface of the insert. Instead of using an Inconel 909 alloy support structure, a niobium supporting structure was applied by chemical vapor deposition from a niobium chloride, hydrogen, and argon mixture at about 1100 degrees Celsius. The niobium was deposited to a thickness of about 0.130 inches. Prior to the niobium deposition the rhenium coating was belt sanded to a smooth finish. The niobium was deposited in 6 layers of approximately 0.025 inches each which were belt sanded smooth and vapor degreased between each deposition run. The insert was machined to a final dimension of 0.810 inches. A 4140 steel tube was machined to an inside diameter of 0.805 inches and shrink fitted to the insert at a temperature of about 750 degrees centigrade. The steel was masked and the mandrel was leached out with acid. The life of the resulting gun barrel is greatly extended as compared with a conventional 4340 steel barrel, thus resulting in increased efficiency, greater utility and longer equipment life cycles.

Repetition of this example using an electrolytic deposit of palladium as a bond enhancer on the rhenium deposit before the niobium is deposited results in a very superior metallurgical bonding. An electrolytic deposit of ruthenium likewise results in superior metallurgical bonding. Alloys of palladium and ruthenium may be used if desired.

When the supporting structure includes titanium or niobium the preferred bonding enhancers include, for example, ruthenium, rhodium, palladium and mixtures thereof. Thus, Group VIII metals having atomic numbers between 44 and 46, which includes the individual metals as well as mixtures of these elements, may be used.

EXAMPLE 4

An insert similar to the one described in Example 2 was fabricated by vapor depositing rhenium onto a molybdenum coupon having a tubular section. This coupon was subjected to repeated firing simulation. The firing was simulated by a vented bomb combustion test. This test simulates the thermochemical environment which exist in the actual firing of ordnance. After the simulations, no erosion was observed in the rhenium coating and no cracking or other microstructural damage was observed. A nitrided 4340 steel insert after being subjected to identical simulation, lost 119 milligrams by erosion in the first "shot" alone. This simulated testing demonstrated reduced bore erosion of 200 and 2000 times compared to Ta-10W and nitrided 4340 steel, respectively.

EXAMPLE 5

An insert similar to Example 4 was fabricated by machining a bore into a powder metallurgically prepared molybdenum-49 rhenium alloy. After subjecting this insert to five shots using Hercules JA2 propellant, 0.6 milligranm per shot erosion was measured. Scanning electron microscope metallography revealed the presence of corrosion pits on the molybdenum-49 rhenium alloy surface exposed to the erosive conditions. A pure rhenium insert subjected to an identical test firing eroded less than 0.2 milligrams per shot and suffered no surface damage.

EXAMPLE 6

A rhenium liner is prepared according to the procedure described in Example 1. Just before the the rhenium deposition phase is terminated the temperature is changed to about 1,000 degrees centigrade so as to cause the formation of a roughened deposit on the surface. No nickel layer is deposited. A 0.75 inch thick carbon-carbon composite shell is formed in situ on the roughened surface as described in greater detail in, for example, in Tuffias, Ser. No. 08/254,515 Jul. 14, 1998 as U.S. Pat. No. 5,780,157. The shell is composed of a matrix of carbon with carbon filament inclusions formed in situ against and tightly bonded to the roughened surface. The resulting structure is suitable for use as a gun barrel.

The substitution of other high strength matrix filamentary materials results in the formation of suitable composite structures.

The best mode presently contemplated for practicing the invention to make gun tubes and projectile launchers is that wherein rhenium or rhenium alloys are deposited by chemical vapor deposition procedures from rhenium pentachloride or metal halides on a sacrificial mandrel at approximately 1025 degrees centigrade to form a gun tube insert. Pure rhenium provides the longest life but alloys, particularly with molybdenum, are very effective and at much lower cost. The choice is based on cost versus length of life considerations where each application is unique. Molybdenum-rhenium alloys containing no more than approximately 80 percent molybdenum may be used in place of pure rhenium. A layer of nickel, cobalt or nickel-cobalt alloy is deposited by electrolytic plating on the rhenium deposit. Nickel, cobalt and the alloys thereof appear to be about equally effective but nickel is generally less costly. Where cost is to be minimized, nickel is preferred. The resulting insert is shrink fitted into a conventional gun barrel steel tube to from a gun barrel. The combined structure is heat treated so that A metallurgical bond is formed between the insert and the gun barrel steel tube.

This invention has been described with reference to several particular embodiments. However, it should be obvious to those skilled in the art to which this invention pertains that other modifications and enhancements, including, without limitation, the reversal, substitution and transposition of parts, materials and steps, as may be appropriate within the understanding of those skilled in the art to whom this is addressed, can be made without departing from the spirit and scope of the claims that follow.

What is claimed is:

1. A high temperature, high pressure, erosion and corrosion resistant composite gun tube structure comprising:

a radially inner first layer having an effective amount of rhenium establishing a high temperature, erosion and corrosion resistant metal, said first layer being selected from the group consisting of rhenium, tungsten rhenium alloys and molybdenum rhenium alloys, and having an elongation in excess of about 4 percent;

a radially outer second layer of structural metal having a tensile strength greater than approximately 100,000 pounds per square inch; and a transition layer forming a metallurgical bond between said first and said second layers, said transition layer including an effective amount of a bond promoting metal to promote bonding between said first and second layers, said transition layer comprising a solid solution of the metals of said first and second layers and said metallurgical bond promoting metal, said high temperature, high pressure, erosion and corrosion resistant composite gun tube structure being capable of repeatedly withstanding internal temperatures in excess of about 2000 degrees Celsius.

2. A composite structure as claimed in claim 1 in which said high temperature, erosion and corrosion resistant metal has a ductile to brittle transition temperature below approximately 400 degrees Celsius.

3. A composite structure as claimed in claim 2 in which said high temperature, erosion and corrosion resistant metal is selected from the group consisting of rhenium, molybdenum-49 rhenium, molybdenum-30 rhenium, and tungsten-24 rhenium alloys.

4. A composite structure as claimed in claim 1 in which said structural metal is selected from the group consisting of iron, nickel and cobalt based alloys.

5. A composite structure as claimed in claim 1 wherein said metallurgical bond promoting metal comprises nickel, cobalt or mixtures thereof.

6. A composite structure as claimed in claim 1 and being capable of repeatedly withstanding internal pressures of at least about 60,000 pounds per square inch.

7. A high temperature, high pressure and erosion and corrosion resistant composite gun tube structure comprising:

a radially inner first layer consisting essentially of a metal selected from the group consisting of rhenium and rhenium alloys containing more than approximately 20 percent by weight rhenium, said first layer having a melting point in excess of about 1400 degrees Celsius, and an elongation in excess of about 4 percent;

a radially outer second layer of structural metal having a tensile strength greater than approximately 100,000 pounds per square inch, a transition layer forming a metallurgical bond between said first and second layers, said transition layer including an effective amount of a metallurgical bond promoting metal to promote metallurgical bonding between the first and second layers, said transition layer comprising a solid solution of the metals of said first and second layers and said metallurgical bond promoting metal, said high temperature, high pressure, erosion and corrosion resistant composite gun tube structure being capable of repeatedly withstanding internal propellant gas temperatures in excess of about 2000 degrees centigrade and pressures of at least about 60,000 pounds per square inch.

8. A composite structure as claimed in claim 7 wherein said metallurgical bond promoting metal comprises nickel, cobalt or mixtures thereof.

9. A composite structure as claimed in claim 7 in which said radially inner first layer has a thickness of from about 0.003 to about 0.040 inches.

10. A high temperature, high pressure and erosion and corrosion resistant composite gun tube structure comprising:

a first layer of a rhenium alloy containing more than approximately 20 percent by weight rhenium and having a melting point in excess of about 1400 degrees Celsius, said first layer having a roughened outer surface and an internal gun tube bore; and a structural composite shell having a matrix with filimantary inclusions formed in situ against said roughened surface and having a tensile strength greater than approximately 20,000 pounds per square inch.

\* \* \* \* \*